US009565788B2

(12) United States Patent
Leizgold et al.

(10) Patent No.: US 9,565,788 B2
(45) Date of Patent: Feb. 7, 2017

(54) MOBILE DATA PROCESSING CENTER

(71) Applicant: SIXSIGMA NETWORKS MEXICO, S.A. DE C.V., Delegación Cuajimalpa (MX)

(72) Inventors: Sergio Rosengaus Leizgold, Delegación Cuajimalpa (MX); Santiago Suinaga Sainz, Delegación Cuajimalpa (MX); Dax Didier Simpson, Delegación Cuajimalpa (MX)

(73) Assignee: SIXSIGMA NETWORKS MEXICO, S.A., DE C.V., Delegacion Cuajimalpa (MX)

( * ) Notice: Subject to any disclaimer, the term of this patent is extended or adjusted under 35 U.S.C. 154(b) by 0 days.

(21) Appl. No.: 14/824,783

(22) Filed: Aug. 12, 2015

(65) Prior Publication Data

US 2016/0050788 A1 Feb. 18, 2016

(30) Foreign Application Priority Data

Aug. 13, 2014 (MX) .................... MX/a/2014/009795

(51) Int. Cl.
*H05K 7/20* (2006.01)
*H05K 7/14* (2006.01)
(52) U.S. Cl.
CPC ........ *H05K 7/20745* (2013.01); *H05K 7/1497* (2013.01); *H05K 7/20827* (2013.01)
(58) Field of Classification Search
CPC .......................... H05K 7/1497; H05K 7/20827
See application file for complete search history.

(56) References Cited

U.S. PATENT DOCUMENTS

| 7,852,627 | B2* | 12/2010 | Schmitt | H05K 7/1497 361/694 |
| 8,046,896 | B2* | 11/2011 | Schmitt | G06F 1/20 165/104.33 |
| 8,755,184 | B2* | 6/2014 | Peng | H05K 7/1497 361/679.46 |
| 8,947,879 | B2* | 2/2015 | Broome | H05K 7/1497 165/104.33 |
| 9,155,229 | B2* | 10/2015 | Schmitt | H05K 7/1497 |
| 2006/0082263 | A1 | 4/2006 | Rimler et al. | |
| 2011/0259573 | A1* | 10/2011 | Ezawa | F24F 5/0007 165/253 |
| 2013/0133357 | A1* | 5/2013 | Wei | F25D 17/04 62/419 |
| 2015/0145391 | A1* | 5/2015 | Broome | H05K 7/1497 312/236 |

FOREIGN PATENT DOCUMENTS

WO     2010065903 A1    6/2010

* cited by examiner

*Primary Examiner* — Robert J Hoffberg
(74) *Attorney, Agent, or Firm* — Nixon Peabody LLP; Khaled Shami

(57) ABSTRACT

The present mobile processing data center comprises a support structure, which consisting in ISO standard containers of 10, 20, 40 or 53 feet, wherein the container comprises: a) automatic transfer switch; b) uninterruptible power system; c) precision air conditioners; d) cabinets having a bearing and rails system, and 42 RMS in order to install the IT equipment; f) two levels of trays ladder type installed on the top of the cabinets, one tray for data wiring and other for power wiring; g) removable floor panels; and h) additionally the mobile data center comprises a fire protection system "zero-footprint".

7 Claims, 8 Drawing Sheets

MOBILE DATA PROCESSING CENTER

CROSS-REFERENCE TO RELATED PATENT APPLICATION

The present application claims priority to Mexico Application No. MX/a/2014/009795 entitled "MOBILE DATA PROCESSING CENTER" filed Aug. 13, 2014, the contents of which is incorporated herein by reference in its entirety.

OBJECT OF INDUSTRIAL IMPROVEMENT

The objective of the present invention consists in a considerable improvement in the data centers already existing of this type, where by using an ISO standard container of 53, 40, 20, and 10 feet (1615.4, 1219.2, 609.6 and 304.8 cm) in length is accomplished to optimize the available space to install a DPC (Data Processing Center) with the capacity for: 14, 8, 4, or 2 equipment cabinets of IT (Information Technology), with total capacities ranging from 9 kW to 60 kW of power and with redundancy N+1.

BACKGROUND

The first data centers required several floors of a building or even the entire building. These facilities usually have a great impact because of the various components that needed for the maintenance of the facilities.

Therefore, the centralized information in this type of data centers is used for computers, communication equipment and other electronic equipment, and with the increasing use of the Internet, it has become essential that this type of data processing centers become much simpler, smaller and therefore that it can be transported from one place to another, in other words to be a mobile data processing center.

In the following patent applications, various mobile data processing centers are observed, being the nearest documents to the present invention.

The first of them is the document US 2006/0082263 A1 which refers to a mobile data processing center which is located inside a container, inside of this container it is located the portion that refers to at least a cooling unit built and disposed to extract the hot air from the second passageway and supply cool air to the first passageway in order to cool the computer equipment inside the container, and other to the electronic equipment, which is a stand-alone system that includes space to accommodate RACKS of 500 "U" of electronic equipment. The RACKS provide 130 kW of power.

The application WO 2010/065903 A1 also relates to data centers having a mobile structure, one or more enclosures for removable electronic equipment, wherein the removable enclosures are hosted in the support structure, a cooling system in fluid communication with the enclosures for the cooling of the electronic equipment in which the cooling system is hosted in the support structure, and a power system connected in operational way to electronic device and the cooling system to supply power to the same in which the supply system comprises a generator hosted in the support structure.

Therefore, there is a specific need for a mobile data processing center, wherein the conventional applications of construction of the previous DPC, do not represent a viable opportunity due to the following reasons:

Lack of physical space in facilities/buildings.
Requirement to update the electromechanical equipment that requires turning off equipments.
Remote locations or difficult access.
Requirements for temporary use wherein the investment (CapEx) is not acceptable by its cost/benefit ratio.
Versatility of movement.

In addition to all the requirements, there are still items and requirements that cannot be ignored in a Data Processing Center such as:

Capacity of growth
Redundancy
Availability
Reliability
Security
Technical support Here is wherein the Mobile Data Centers that are organized in containers are born. In general terms, the DPC's in containers have given the opportunity to meet the requirements and needs above described in general terms. However, the existing applications have limitations that have been improved with our mobile DPC called "Kio/ATOM".

DETAILED DESCRIPTION OF THE INDUSTRIAL IMPROVEMENT

Figure 1:
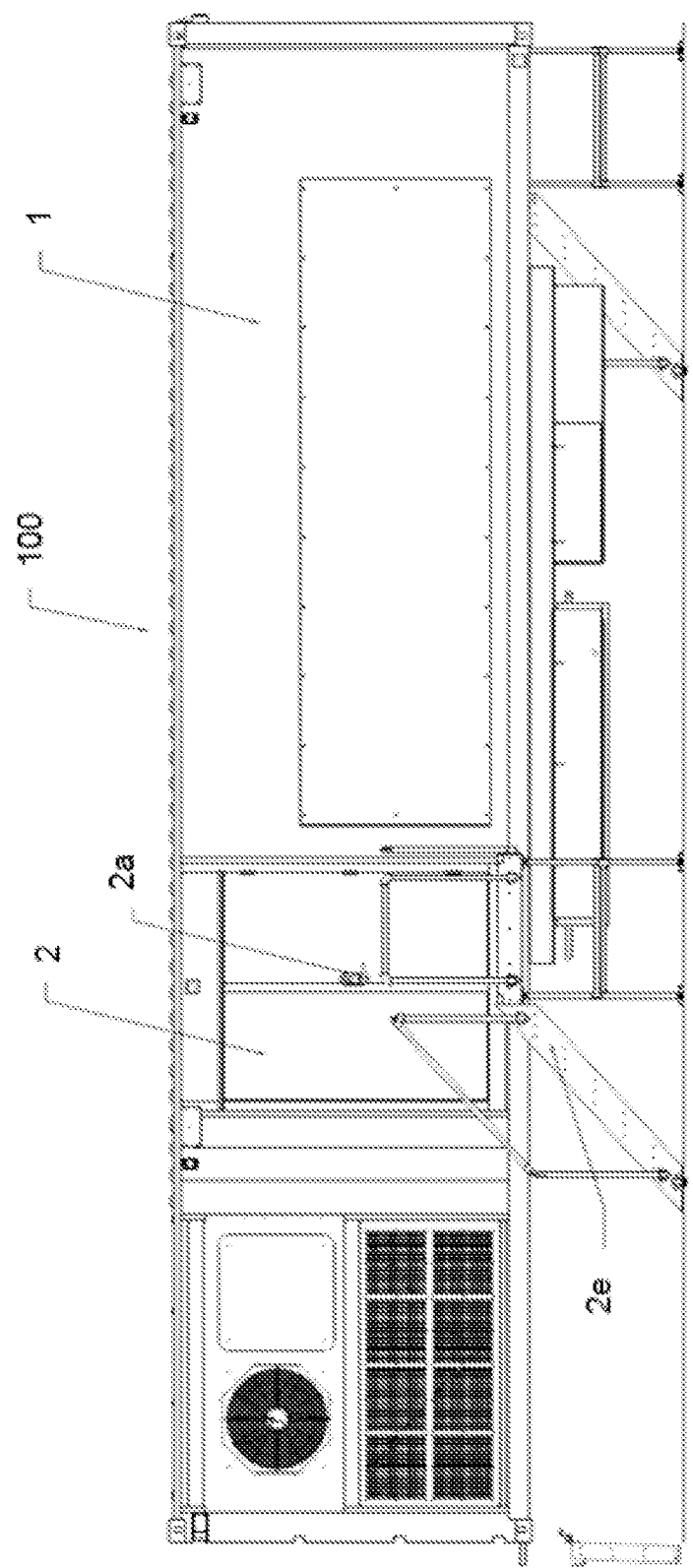
FIG. 1 is an external view of the ISO Standard container of 40 feet in length.

The present invention relates to a mobile DPC (100) called Kio/ATOM which consists of using ISO standard containers (1) from 10 to 53 feet (304.8 to 1615.4 cm) in length, which have been prepared to improve the existing offer, adapting each of their internal walls with a thermal insulation intended to maintain the required temperature in the different areas that comprise the container.

In general, the mobile DPC Kio/ATOM comprises two sections, the first section (3) in order to locate the heat exchangers (5) and the main electric distribution panel (21), and the second section (4) wherein there are located the evaporators (8) and the items that require to be permanently air-conditioned.

Figure 2:
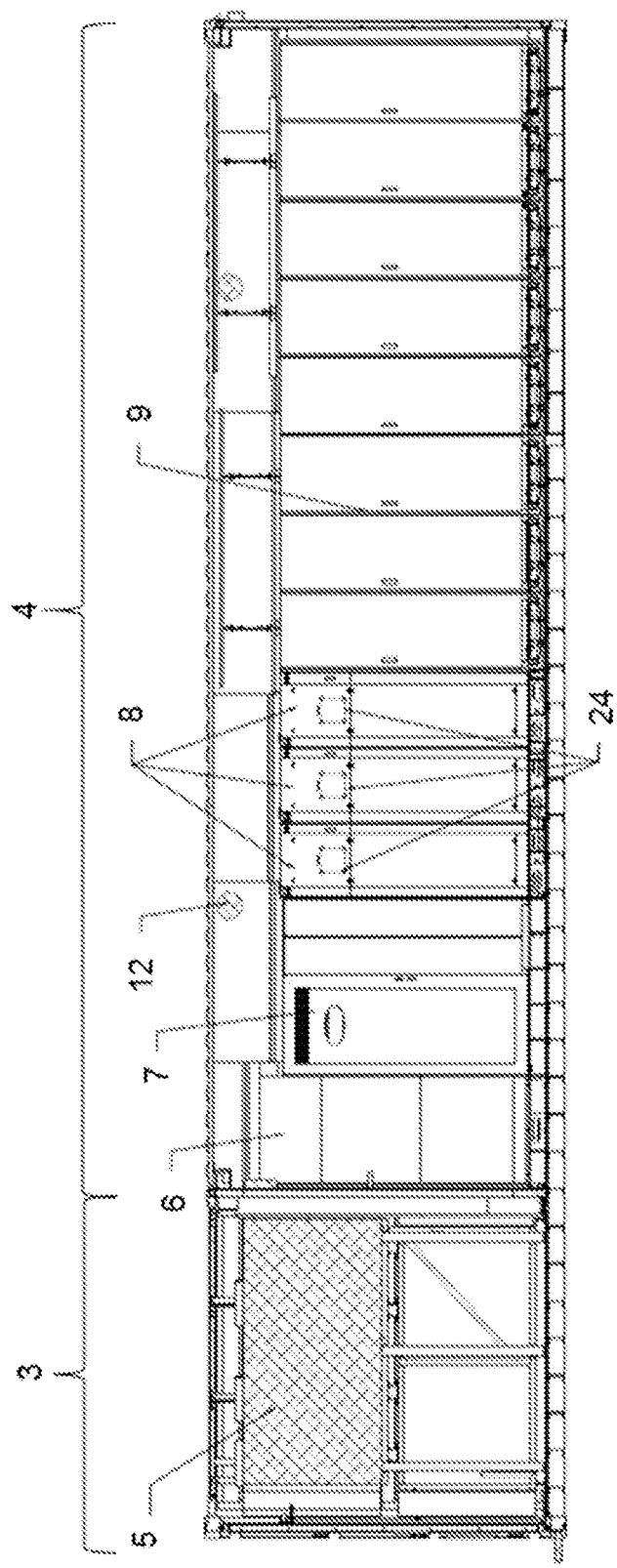
FIG. 2 is an internal view of the items comprising the mobile DPC Kio/ATOM.
Figure 9:
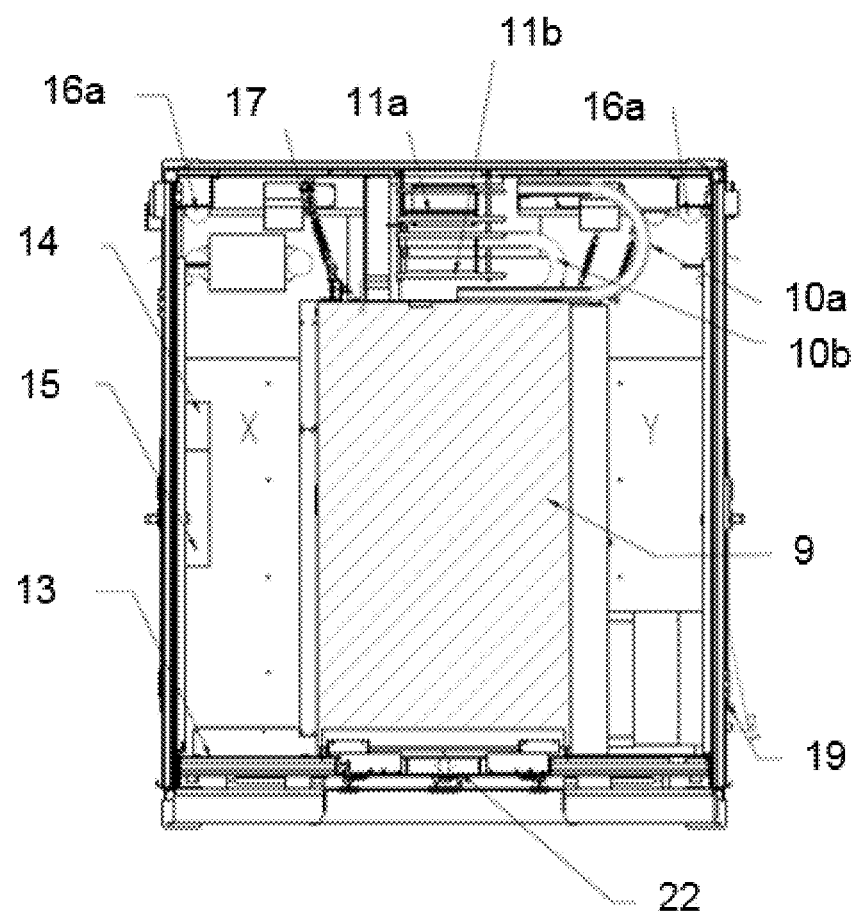
FIG. 9 is a cut wherein are located the equipment and items that require to be permanently air-conditioned (4).
Figure 10:
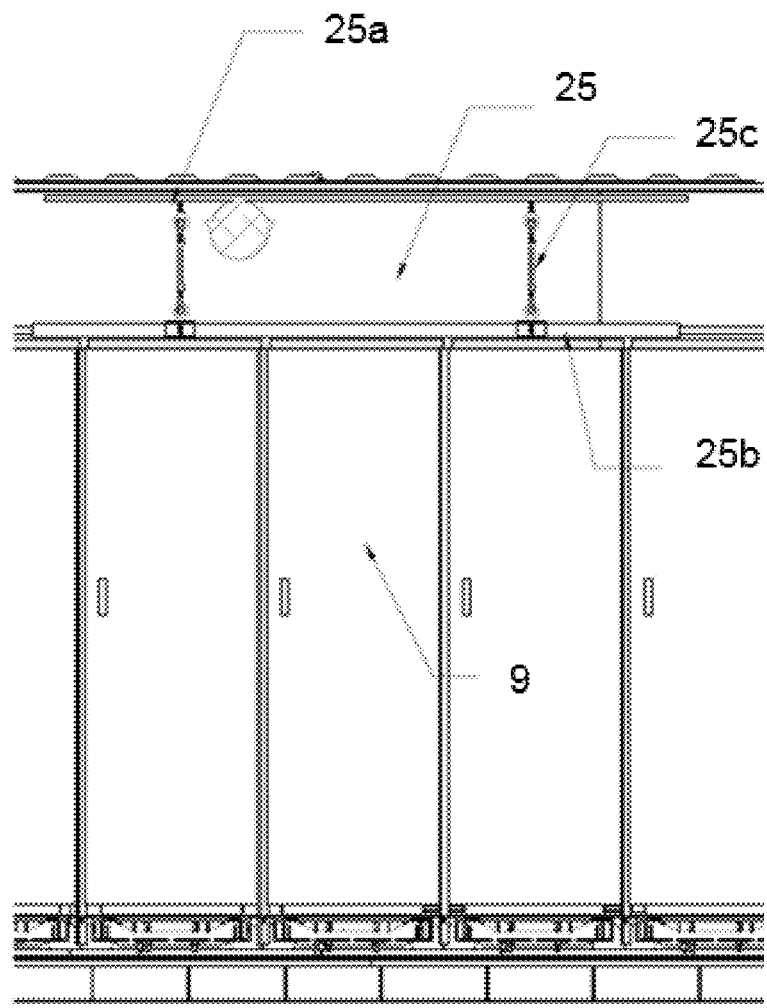
FIG. 10 is a detail illustrating the clamping means of the cabinets.

As shown in FIGS. 1 and 2, the mobile DPC is composed by:

1. An Automatic Transfer Switch (ATS) (6) with Insulation Bypass for maintenance operations without the need to shutdown the aforesaid equipment. The "Bypass" system consists in the motion of a lever in the ATS wherein it disables the electronic portion of the device and continues in manual operation in order to provide preventive maintenance to the electronic components, 2. An Uninterruptible Power Supply System (7) (UPS) from 9 kW to 60 kW of power capacity with redundant modules in the configuration N+1. The UPS is connected right after the ATS in order to regulate the power from service provider (Federal Electricity Commission (CFE) type) or, otherwise, regulate the power from the moto-electric generator when the power from provider is not available, 3. In the case of containers of 53 and 40 feet (1615.4 and 1219.2 cm), three evaporators (8) with precision of 35 kW each one in the configuration N+1, and for containers of 20 and 10 feet (609.6 and 304.8 cm) two evaporators (8) with precision of 19 kW each of them in the configuration N+1, which work in conjunction with heat exchangers (5) through a direct expansion cycle; each evaporator (8) comprises a smart microprocessor (24) which manages the temperature and relative humidity of the air-conditioned section. The microprocessor is a computer located in the front of each evaporator machine wherein the configurations required to air-condition the operating environment of the IT equipment are carried out according to requirements of equipment manufacturers. Likewise, the microprocessor operates by means of two temperature and relative humidity sensors (not shown), which are located in the same evaporators (8), one located in the front in order to measure both variables in the supply air outlet and another located at the back in order to measure the variables in the return air inlet in such a manner that can be ensure to have a cool aisle (X) and a hot aisle (Y) (see FIG. 9). The sensors are used by a microprocessor (24) to calculate, using an algorithm, the parameterized requirements of temperature and relative humidity to air-condition properly the IT equipment, 4. Fourteen, eight, four or two cabinets (9) of 600 mm in width, 1000 mm depth and forty-two RMS to install the IT equipment. In order to affix the cabinets (9) to the container and avoid movements, each of them comprises clamping means (25) comprising an uni-channel (25a) attached to the container, an uni-channel (25b) attached to the cabinet and a tensor (25c), and on its bottom and with the purpose of facilitating its mobility, they have a bearing (22) and rails (23) system. Likewise, at the top of each cabinet, there are two flexible wire organizers (10), one for power (10b) and another for data (10a), 5. Two ladder type cable trays (11) made of stainless steel, installed perpendicularly on the top of the cabinets. One tray (11b) for data wiring (bottom) and other for power wiring (11a) (top), 6. Removable floor panels (13) made of aluminum and steel galvanized material, 7. High Sensitivity Smoke Detector (HSSD) (14) for an early detection of smoke, 8. A fire protection system using: a control panel (15), two abort stations (20) to prevent the expelling of aerosol agent in the containers (12) in the case of a false possibility of fire, four sirens/strobe lights (18), in the containers of 53 and 40 feet (1615.4 and 1219.2 cm) four containers of the aerosol agent, and in the containers of 20 and 10 feet (609.6 and 304.8 cm) two containers of the aerosol agent (12).

9. A surveillance video recording device (CCTV) and four high-resolution cameras (16), two internal (16a) and two external (16b).

10. Internal walls with thermal and acoustic insulator treatment of polyurethane material, and an additional galvanized steel liner.

11. LED lighting (17).

Figure 7:
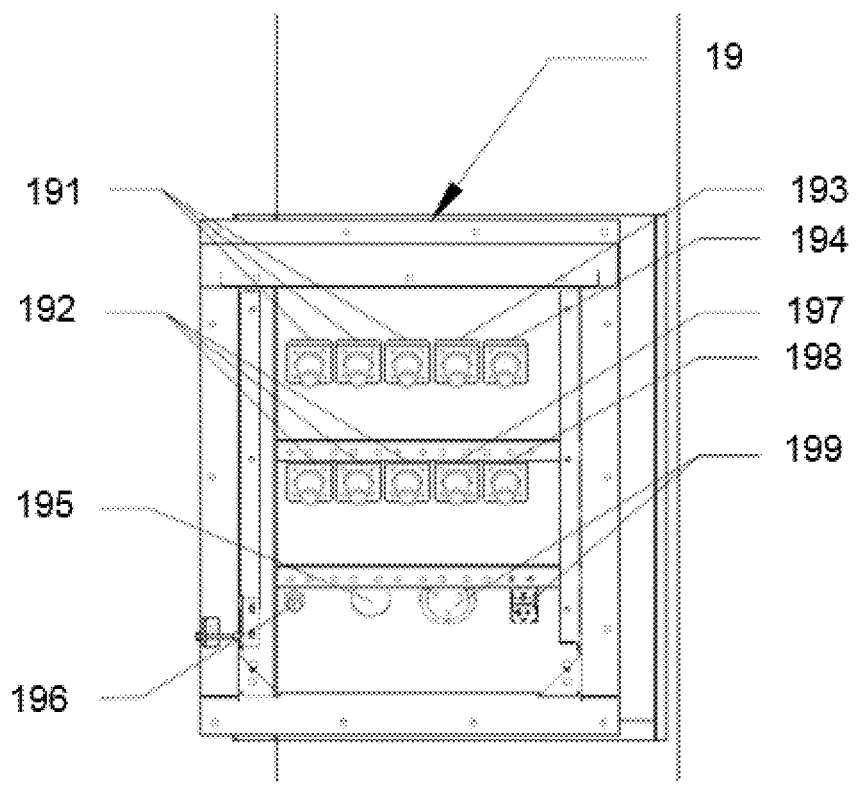
FIG. 7 is a detail showing the electrical connection center and optical fiber inlet Razorback (trademark) (19).
Figure 8:
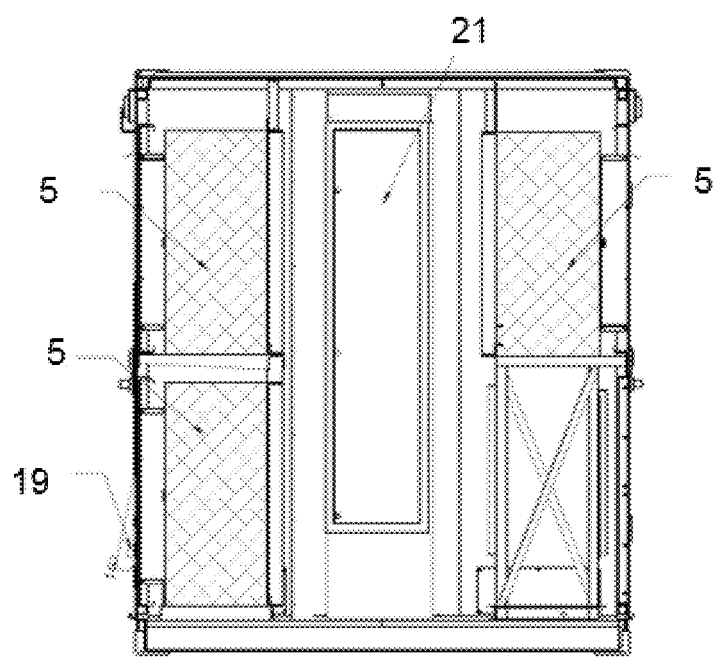
FIG. 8 is a cut of the heat exchange area (3).

12. An electrical connection center and optical fiber inlet (Razorback) (trademark) (19), wherein the electrical connection center is divided in preferential 3 phase power (191), 1 neutral (193), 1 ground (194) and 3 phase emergency power (192), 1 neutral (197), 1 ground (198); an optical fiber inlet (195); an inlet (196) for communication wiring between the emergency source and the switch (6); and connections for external services (199) (See FIG. 7).

Figure 5:
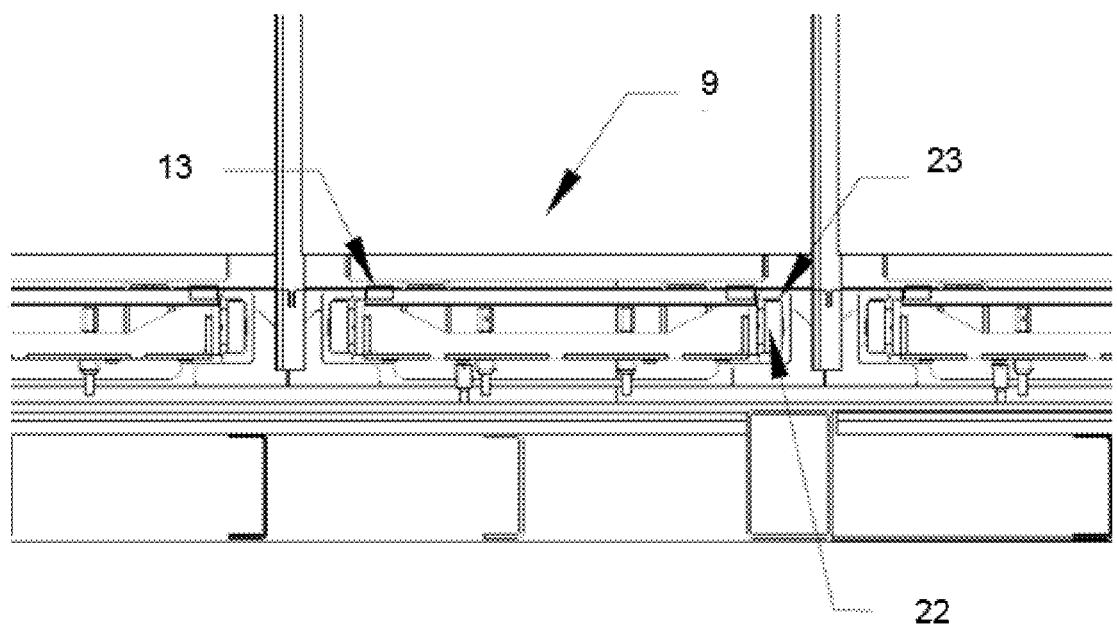
FIG. 5 is a detail illustrating the bearings and rails at the bottom.
Figure 6:
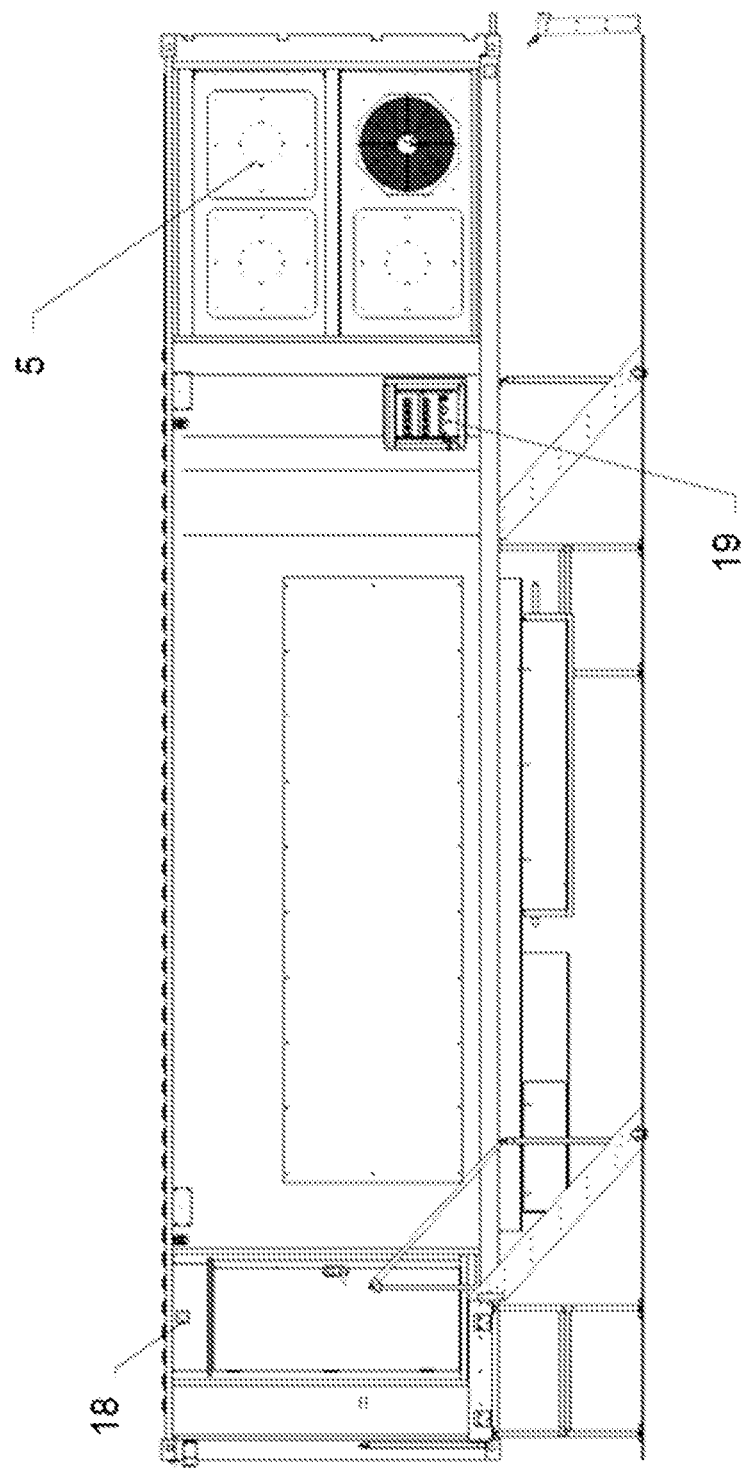
FIG. 6 is an external view of the container showing the opposite side illustrated in FIG. 1.

Due to space constraints, an ISO Standard container having located a cabinet in the center of the free space that does not allow the entry of the IT equipment, since a conventional server has no less than 900 mm depth and the free space in front of the cabinet is only 600 mm. Thus, the cabinets of the mobile DPC Kio/ATOM were designed with bearings (22) and rails (23) at the bottom (See FIG. 5) to allow increasing the space in the front of the cabinets and be able to enter the IT equipment without any problem; additionally in the cabinets the flexible organizers (10) are placed at the top so that the displacement of the cabinets forward or backward does not affect the strength or the integrity of the electrical and data wiring that supply the services to each cabinet (See FIG. 2)

Figure 3:
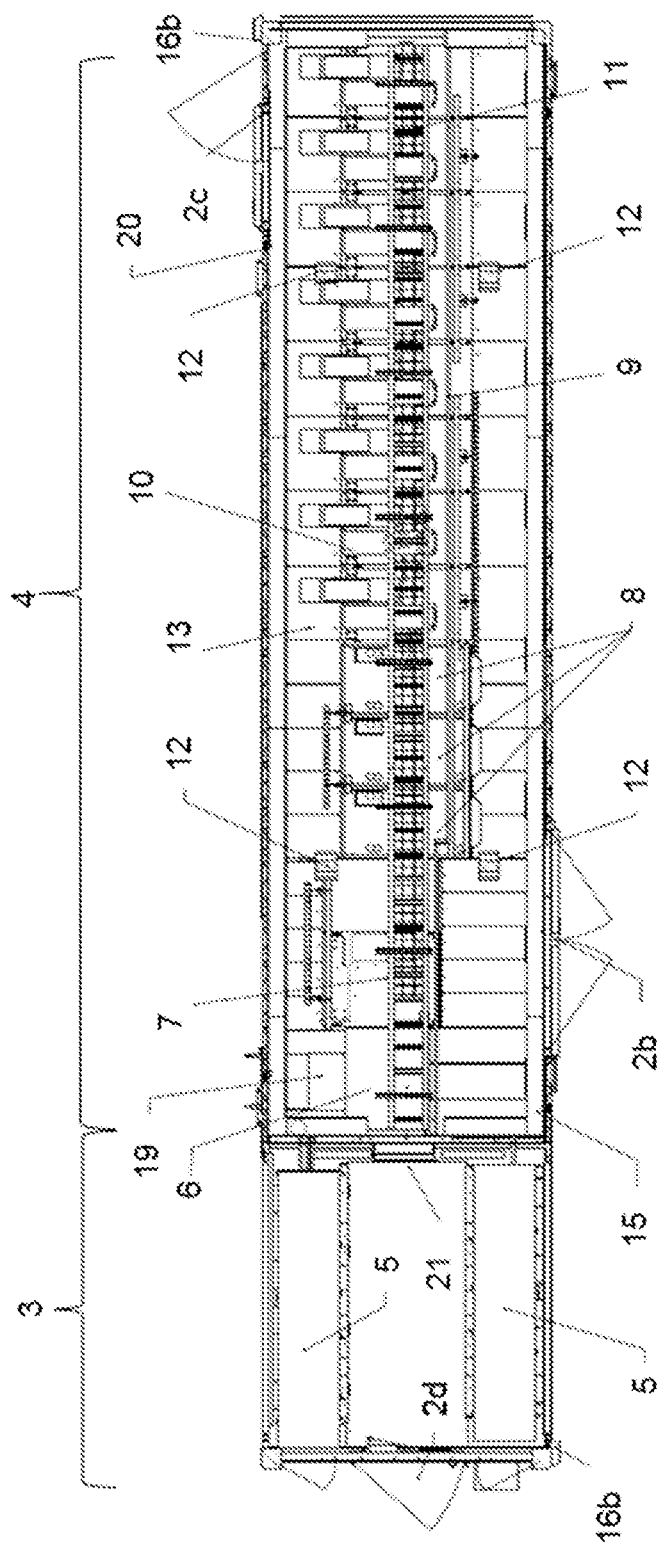
FIG. 3 is a plan view of the items comprising the mobile DPC Kio/ATOM.

On the other hand, the space is optimized in our design by installing a fire protection system that does not use physical space on the floor; this is beneficial as it allows to host an additional cabinet for IT equipment (See FIG. 3).

Figure 4:
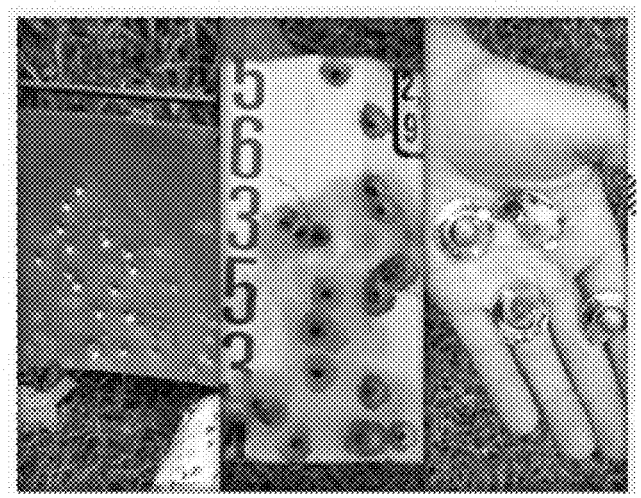
FIG. 4 is a view of the sheet used to strengthen the physical security of the container and provide it properties of bullet resistance.

FIG. 4 is a representation of another improvement of the invention consisting in the installation of a galvanized steel liner which strengthens the physical security of the container making it resistant to bullets in compliance with the UL 752 standard, which ensures the Level 4 protection against projectiles of 2,000 feet per second (609.6 meters per second).

It is to be noted that the mobile data center of the present invention also has various accesses (2), of which, a double gate (2b) provides access to the cool aisle (X) and ensures the suitable access for the battery maintenance of the UPS, which also ensures the battery maintenance of the UPS; a simple gate (2c) that ensures the access to the hot aisle; and the gate (2d) that provides access to the area (3) wherein the exchangers (5) are located.

It is important to appoint that each of the accesses (2) comprises an access control (2a) with combination keys, as well as an access ladder (2e) having the ability to be detachable.

ABBREVIATIONS USED

1 DPC: Abbreviation for Data Processing Center
2. ATS: Abbreviation for "Automatic Transfer Switch".
3. kW: Abbreviation for Kilowatt
4. "N": Abbreviation for REQUIREMENT, related to the power required in power and air conditioning for computer equipment.
5. Redundancy: Item of support for contingency.
6. N+1: Abbreviation for REQUIREMENT plus a redundant item as support.
7. Zero Footprint: Term used to describe an item that does not use physical space on the floor.
8. RMS: Abbreviation for the term Rack Mount Slot, that refers to measurement unit in the physical space available to locate an IT equipment.
9. HSSD: Abbreviation for the term High Sensitive Smoke Detection, that refers to the smoke early detection system.

10. UL-752: Abbreviation for Underwriter Laboratories and the numeral of the standard which govern the ballistic resistance levels of different items.

11. Razorback (trademark): Device located in the perimeter of the container Kio/ATOM to connect the power supply cables of commercial power and power of moto-generator, as well as allows the connection of Internet links.

12. LED: Acronym for Light Emition Diode, lighting bulb of low power consumption and long life.

13. CCTV: Abbreviation for Closed-Circuit Television.

14. IT: Information Technology.

Novelty of the Invention

Having described the present invention, the same is regarded as novel and, therefore, we claim the property on the following:

1. A mobile data center comprising:

a) a first section in order to locate heat exchangers and a main distribution panel;

b) a second section in order to locate at least two evaporators controlled by means of a smart microprocessor using information received by two temperature and relative humidity sensors located inside of the at least two evaporators; an Automatic Transfer Switch with an insulation bypass having an ability to carry out maintenance operations without a requirement to shutdown IT equipment, an uninterruptible power supply system with power capacity of 9 kW, 20 kW or 60 kW with a redundant module in a configuration N+1; two, four, eight or fourteen cabinets of 600 mm in width, 1000 mm depth and 42 RMS to install the IT equipment, each of the cabinets having a clamping means to avoid movements, the clamping means formed by a first uni-channel which is attached to a mobile container, a second uni-channel attached to each of the cabinets and a tensor, additionally and to be able to increase space in front of the cabinets, at a bottom of the cabinets there are bearings and rails which are located beneath removable floor panels;

wherein installed perpendicularly on a top of each of the cabinets there are located ladder type trays, a bottom tray of the ladder type trays for data wiring and other upper for power wiring; as well as wire flexible organizers, a left wire for power and a right wire for data;

wherein the mobile data center also has a smoke early detection system that operates by means of an air particle analyzer system, backed up in the event of fire using a control panel, two abortion stations that may prevent the expelling of an aerosol agent in aerosol containers in the event of a false possibility of fire, and four sirens, and two to four of the aerosol containers which containing the aerosol agent; and wherein the aerosol container comprises a galvanized steel liner comprising a ballistic protection level 4 in compliance with the standard UL 752.

2. The mobile data center according to claim 1, further comprising: a surveillance video recording device comprising four high-resolution cameras, wherein two cameras of the four high-resolution cameras are internal cameras capturing internal views of the mobile container and two cameras of the four high-resolution cameras are external cameras capturing external views of the mobile container.

3. The mobile data center according to claim 1, wherein the removable floor panels are made of aluminum and galvanized steel material.

4. The mobile data center according to claim 1, having accesses, wherein each of the accesses comprises an access control by means of combination keys and an access ladder.

5. The mobile data center according to claim 1, having a lighting system using LED technology.

6. The mobile data center according to claim 1, including an electrical connection center and optical fiber inlet, wherein the electrical connection center is divided in a preferential power including 3 phase preferential power, 1 preferential neutral, and 1 preferential ground and an emergency power including 3 phase emergency power, 1 emergency neutral, and 1 emergency ground; an optical fiber inlet; an inlet for communication wiring between an emergency source and a switch; and external services connections.

7. The mobile data center according to claim 1, including containers with dimensions from 10 to 53 feet in length and having thermal insulation in internal walls of the mobile container, and configured to accommodate first and second sections, which are electrically powered via an electric distribution panel.

* * * * *